(12) United States Patent
Zheng

(10) Patent No.: US 8,928,019 B2
(45) Date of Patent: Jan. 6, 2015

(54) PHOSPHOR AND LEDS CONTAINING SAME

(75) Inventor: Yi Zheng, Lynnfield, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 246 days.

(21) Appl. No.: 13/583,504

(22) PCT Filed: Mar. 30, 2011

(86) PCT No.: PCT/US2011/030536
§ 371 (c)(1),
(2), (4) Date: Sep. 7, 2012

(87) PCT Pub. No.: WO2011/123538
PCT Pub. Date: Oct. 6, 2011

(65) Prior Publication Data
US 2012/0326196 A1    Dec. 27, 2012

Related U.S. Application Data

(60) Provisional application No. 61/319,666, filed on Mar. 31, 2010.

(51) Int. Cl.
*H01L 33/00* (2010.01)
*C09K 11/77* (2006.01)
*C04B 35/44* (2006.01)
*H01L 33/50* (2010.01)

(52) U.S. Cl.
CPC ............ *C09K 11/7774* (2013.01); *C04B 35/44* (2013.01); *H01L 33/502* (2013.01); *C04B 2235/3224* (2013.01); *C04B 2235/3225* (2013.01); *C04B 2235/3229* (2013.01); *C04B 2235/656* (2013.01); *C04B 2235/6582* (2013.01); *C04B 2235/6588* (2013.01); *C04B 2235/764* (2013.01); *C04B 2235/9653* (2013.01); *C04B 2235/9661* (2013.01)

USPC .............. 257/98; 257/E33.061; 252/301.4 R

(58) Field of Classification Search
USPC ....... 257/98, E33.061; 252/301.4 R; 313/503, 313/498, 501
See application file for complete search history.

(56) References Cited

U.S. PATENT DOCUMENTS 5,998,925 A  12/1999  Shimizu et al.
6,669,866 B1  12/2003  Kummer et al.
(Continued)

FOREIGN PATENT DOCUMENTS

| | | | | |
|---|---|---|---|---|
| CN | 1482208 A | | 3/2004 | |
| JP | PCT/JP2009/052818 | * | 2/2009 | .............. H01L 33/00 |
| KR | 10-2008-0110857 A | | 12/2008 | |
| WO | 2008-012712 A1 | | 1/2008 | |
| WO | 2008-058462 A1 | | 5/2008 | |

OTHER PUBLICATIONS

Sato et al., Spectral Parameters of Nd3+-ion in the Polycrystalline Solid-Solution Composed of Y3Al5O12 and Y3Sc2Al3O13, Jpn. J. Appl. Phys., 42 (2003) 5071-5074.

(Continued)

*Primary Examiner* — Shaun Campbell
(74) *Attorney, Agent, or Firm* — Robert F. Clark

(57) ABSTRACT

There is herein described a phosphor for use in LED applications and particularly in phosphor-conversion LEDs (pc-LEDs). The phosphor has a composition represented by $(Y_{1-x}Ce_x)_3(Al_{1-y}Sc_y)_5O_{12}$ wherein $0<x\leq 0.04$ and $0<y\leq 0.6$ and can be as applied to an LED as a transparent sintered ceramic or used in a powder form. By adjusting the composition of the phosphor, the phosphor can be made to emit light in the green to yellow regions of the visible spectrum upon excitation by a blue-emitting InGaN LED.

6 Claims, 5 Drawing Sheets

(56) References Cited

U.S. PATENT DOCUMENTS

| | | |
|---|---|---|
| 6,809,347 B2 | 10/2004 | Tasch et al. |
| 6,943,380 B2 | 9/2005 | Ota et al. |
| 7,045,826 B2 | 5/2006 | Kim et al. |
| 7,267,787 B2 | 9/2007 | Dong et al. |
| 8,299,487 B2 * | 10/2012 | Daicho et al. ............ 257/98 |
| 2004/0004437 A1 | 1/2004 | Shimizu et al. |
| 2005/0088077 A1 | 4/2005 | Naum et al. |
| 2008/0089825 A1 * | 4/2008 | Tamaki et al. ............ 423/263 |
| 2009/0284149 A1 | 11/2009 | Koshikawa et al. |
| 2011/0309302 A1 | 12/2011 | Vishnyakov et al. |

OTHER PUBLICATIONS

Feng et al., Preparation of transparent Ce:YSAG ceramic and its optical properties, J. Eur. Ceram. Soc., 28 (2008) 2539-2543.

Feng et al., Effect of Sc Substitution for Al on the Optical Properties of Transparent Ce:YSAG Ceramics, J. Am. Cer. Soc., 91 [7] (2008) 2394-2397.

Search report for sibling PCT/US2011/030536 mailed Nov. 22, 2011.

* cited by examiner

PHOSPHOR AND LEDS CONTAINING SAME

CROSS REFERENCE TO RELATED APPLICATIONS

This application claims the benefit of and priority to co-pending PCT application PCT/US11/30536 filed Mar. 30, 2011 and to U.S. Provisional Application No. 61/319,666, filed Mar. 31, 2010.

TECHNICAL FIELD OF THE INVENTION

This invention relates to light emitting diodes (LED) and more particularly to phosphors for use in LED applications such as phosphor-conversion LEDs.

BACKGROUND OF THE INVENTION

Current white-light-emitting phosphor-conversion LEDs (pc-LEDs) utilize one or more phosphors to partially absorb blue light emissions from InGaN LEDs in order to convert some of the blue light into a yellow light. The combination of the remaining unabsorbed blue light and converted yellow light yields light which is perceived as white. Other phosphors may be used in addition to the yellow-emitting phosphor, for example a red-emitting phosphor, in order to increase color rendering index (CRI) or achieve a different color temperature (CCT). However, the yellow-emitting phosphor remains the core component in white pc-LEDs.

The normal yellow-emitting phosphor used in a pc-LED is a cerium-activated yttrium aluminum garnet, $Y_3Al_5O_{12}$:Ce, phosphor (YAG:Ce). However, other phosphors include a cerium-activated terbium aluminum garnet (TAG:Ce) phosphor as described in U.S. Pat. No. 6,669,866 and silicate-based phosphors such as those described in U.S. Pat. Nos. 6,943,380, 6,809,347, 7,267,787, and 7,045,826.

An example of a YAG:Ce phosphor and its application in an LED are described in U.S. Pat. No. 5,998,925. Some composition modifications of YAG phosphors are also described in this patent, such as using Ga to replace Al or Gd to replace Y in the garnet. Generally, Ga substitution of Al shifts the emission peak to shorter wavelength and Gd substitution of Y shifts emission peak to longer wavelength.

SUMMARY OF THE INVENTION

A new phosphor for light emitting diode (LED) applications has been developed with a composition represented by $(Y_{1-x}Ce_x)_3(Al_{1-y}Sc_y)_5O_{12}$ wherein $0<x\leq0.04$ and $0<y\leq0.6$. The color of the light emitted by the phosphor can be changed by adjusting the composition. For example, in one aspect, the phosphor can be used as a yellow-emitting phosphor in white pc-LEDs. In another aspect, the composition of the phosphor may be adjusted such that it may used as a green-emitting phosphor to fully convert the blue emission from a blue-emitting LED to a green emission. This is important since direct green-emitting InGaN LEDs have a very low efficiency. A green-emitting, full conversion pc-LED that uses the higher efficiency blue-emitting InGaN LEDs has the potential to offer more efficient green LEDs.

In accordance with an aspect of the invention, there is provided a phosphor having a composition represented by $(Y_{1-x}Ce_x)_3(Al_{1-y}Sc_y)_5O_{12}$ wherein $0<x\leq0.04$ and $0<y\leq0.6$.

In accordance with another aspect of the invention, there is provided a phosphor-conversion LED comprising: an LED that emits a blue light and a phosphor for converting at least a portion of the blue light into light of a different wavelength, the phosphor having a composition represented by $(Y_{1-x}Ce_x)_3(Al_{1-y}Sc_y)_5O_{12}$ wherein $0<x\leq0.04$ and $0<y\leq0.6$.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

Figure 1:
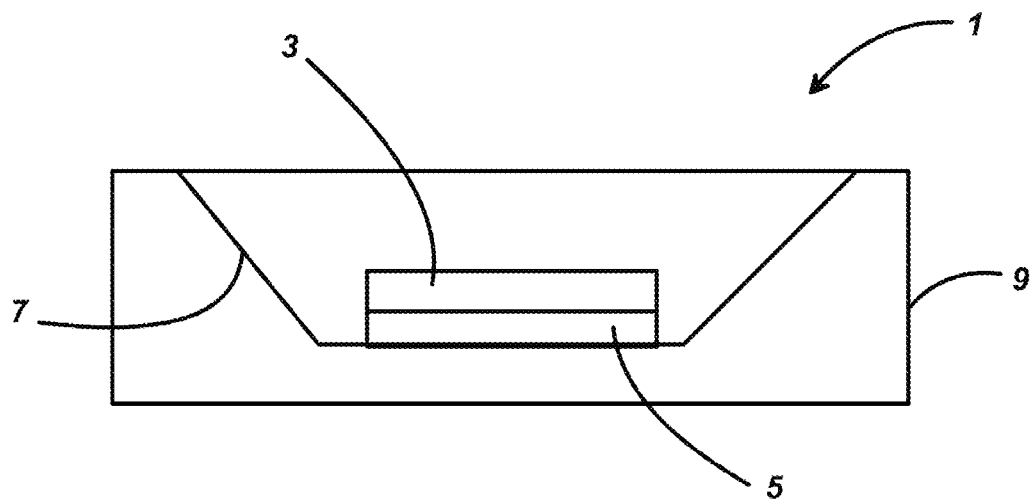
FIG. 1 is an illustration of an embodiment of a phosphor-conversion LED (pc-LED) according to this invention.

FIG. 1 is an illustration of an embodiment of the phosphor-conversion LED 1 of this invention. The phosphor converter 3 in this case is a solid ceramic piece formed by pressing and sintering the powdered phosphor or its oxide precursors. The phosphor converter 3 is placed on top of the blue-emitting LED 5, which preferably emits light having a wavelength from about 420 nm to about 490 nm. The LED 5 is shown here mounted in a module 9 having a well 7 with reflective sides, but the invention is not limited to this particular arrangement.

Figure 2:
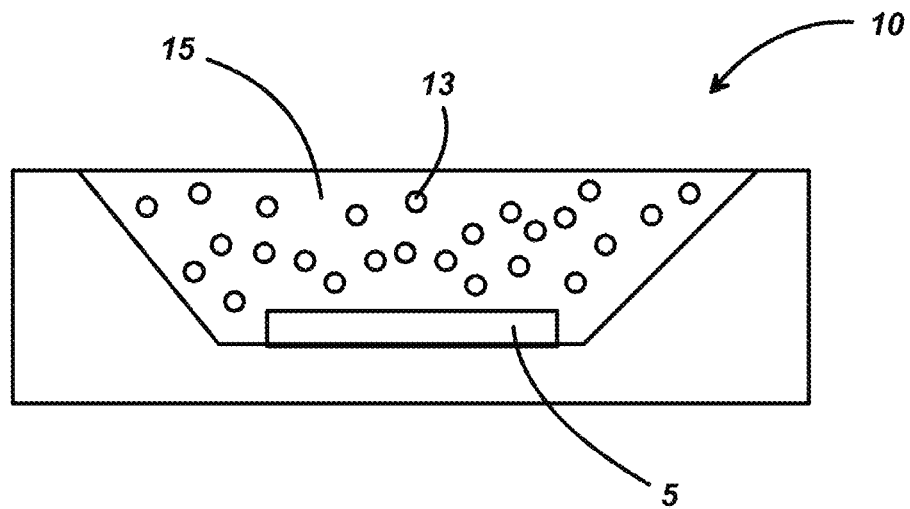
FIG. 2 is an illustration of an alternate embodiment of a pc-LED according to this invention.

FIG. 2 is an illustration of an alternate embodiment of the invention. In this case, the phosphor-conversion LED 10 is encapsulated in a resin 15 in which particles of phosphor 13 are dispersed.

EXAMPLES

Several phosphors of varying composition were made using commercially available oxide powders of $Y_2O_3$, $Al_2O_3$, $Sc_2O_3$ and $CeO_2$ which were mixed in amounts to produce the desired composition (see Table 1). The mixed powders were then pressed into discs and sintered under varying conditions to form the phosphors. Although these samples were formed as sintered ceramic discs, the phosphor may also be formed as a powder.

TABLE 1

| Batch | $Y_2O_3$ (gram) | $Al_2O_3$ (gram) | $Sc_2O_3$ (gram) | $CeO_2$ (gram) | sintering atmosphere |
|---|---|---|---|---|---|
| Y1 | 2.7513 | 1.6447 | 0.5029 | 0.0211 | wet $H_2$ |
| Y2 | 2.4623 | 0 | 2.5189 | 0.0189 | wet $H_2$ |
| Y3 | 2.5988 | 0.786 | 1.5951 | 0.0199 | wet $H_2$ |
| Y4 | 2.6592 | 1.4294 | 0.8286 | 0.0827 | wet $H_2$ |
| Y5 | 2.7115 | 1.4356 | 0.8322 | 0.0208 | wet $H_2$ |
| Y6 | 10.8864 | 5.7468 | 3.3306 | 0.0333 | wet $H_2$ |
| Y7 | 11.2138 | 7.6108 | 1.1443 | 0.0347 | wet $H_2$ |
| Y8 | 10.9668 | 6.203 | 2.7967 | 0.0343 | wet $H_2$ |
| Y9 | 10.7322 | 4.8557 | 4.3781 | 0.0328 | wet $H_2$ |

Example Y1

Example Y1 was made with a nominal composition $(Y_{0.995}Ce_{0.005})_3(Al_{0.8}Sc_{0.2})_5O_{12}$. The powder mix was dry pressed into discs under 300 MPa pressure. The pressed discs were sintered at 1800, 1850, 1880 and 1890° C. under wet $H_2$. The resulting sintered ceramic was a green-yellow color. The ceramic became more translucent as sintering temperature increased. The emission intensity also increased as temperature increased.

Figure 3:
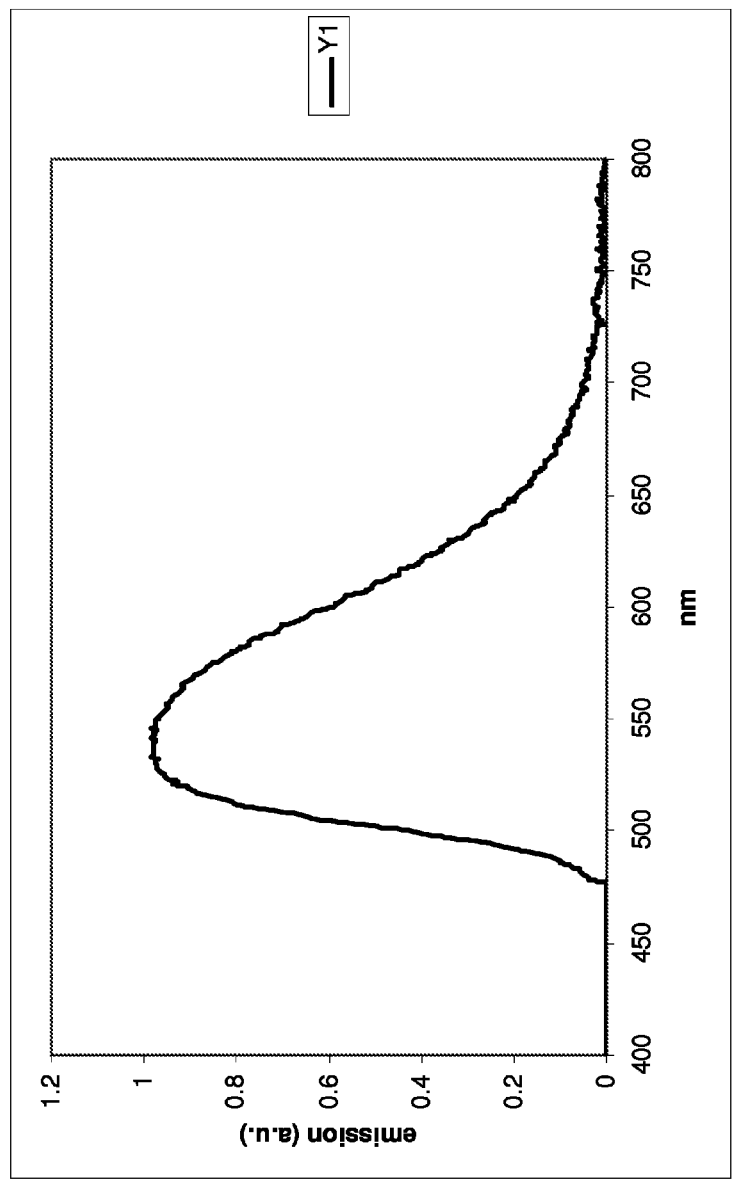
FIG. 3 is an emission spectrum of a phosphor having a composition $(Y_{0.995}Ce_{0.005})_3(Al_{0.8}Sc_{0.2})_5O_{12}$ in accordance with this invention (Example Y1).

An example of Y1 emission under blue-light excitation is shown in the FIG. 3. The emission spectrum exhibits a broad yellow emission with a peak wavelength at 533 nm. The emission spectrum is very similar to YAG:Ce and indicates that the ceramic has a garnet structure.

Example Y2

Example Y2 was made with a nominal composition $(Y_{0.995}Ce_{0.005})_3SC_5O_{12}$. The oxide powders were mixed and dry pressed into discs. The discs were sintered at 1850° C. and 1900° C. The resulting sintered ceramic was orange-red in color. However, no emission was observed under the blue excitation.

Example Y3

Example Y3 was made with a nominal composition $(Y_{0.995}Ce_{0.005})_3(Al_{0.4}Sc_{0.6})_5O_{12}$. Discs were made by dry pressing the oxide powder mixture and then sintering at 1850° C. and 1900° C. Melting occurred when the sintering was done at 1900° C. yielding a near white body color whereas the disc sintered at 1850° C. had a green-yellow color. The emission of Y3 had a peak wavelength at 527 nm which is shifted to a shorter wavelength compared to example Y1.

Examples Y4 and Y5

Examples Y4 and Y5 were made with nominal compositions $(Y_{0.98}Ce_{0.02})_3(Al_{0.7}Sc_{0.3})_5O_{12}$ and $(Y_{0.995}Ce_{0.005})_3(Al_{0.7}Sc_{0.3})_5O_{12}$ respectively. Discs were made again by dry pressing mixed oxide powders and sintering at 1850° C., 1860° C. and 1880° C. The resulting sintered ceramics were translucent with Y4 having a yellow color and Y5 a green-yellow color.

Example Y6

Example Y6 was made with a nominal composition $(Y_{0.998}Ce_{0.002})_3(Al_{0.7}Sc_{0.3})_5O_{12}$. Oxide powders were mixed with DI water, polymer binders, and ball milled for an extended time. The ball-milled slurry was then dried and ground into a powder. Discs were made by isopressing under 30 k Psi. Using ball milling allows for the oxides to be mixed more homogenously and reduces agglomerates. The isopressed discs were sintered at 1850, 1860 and 1880° C. under wet $H_2$. Near fully transparent samples were obtained.

Example Y7

Example Y7 was made with a nominal composition $(Y_{0.998}Ce_{0.002})_3(Al_{0.9}Sc_{0.1})_5O_{12}$. The oxide powders were mixed by ball milling as with Example Y6. The pressed discs were sintered at 1850 and 1880° C. The resulting sintered discs were opaque.

Examples Y8 and Y9

Examples Y8 and Y9 were made to have nominal compositions $(Y_{0.998}Ce_{0.002})_3(Al_{0.75}Sc_{0.25})_5O_{12}$ and $(Y_{0.998}Ce_{0.002})_3(Al_{0.6}Sc_{0.4})_5O_{12}$ respectively. The oxide powders were mixed by ball milling as in Example Y6. The isopressed discs were sintered at 1860 and 1880° C. Both compositions were found to capable of being sintered to near transparency.

Table 2 lists the CIE 1931 color coordinates (Cx,Cy), dominate wavelength (Ldom), peak wavelength (Lpeak), centroid wavelength (Lcentroid) and full width at half maximum (FWHM) of the blue-light-excited emissions for the above examples, except for Y2 which did not exhibit an emission. The $C_x$ color coordinates ranged from about 0.35 to about 0.44 and the $C_y$ color coordinates ranged from about 0.55 to about 0.58.

For the first group, examples Y7, Y1, Y8, Y6, Y9 and Y3, the emission peak shifts towards the green region of the visible spectrum (shorter wavelengths) as the percentage of Sc concentration increases. This behavior is very similar to increasing the level of Ga substitution for Al in $(Y_{1-x}Ce_x)_3(Al_{1-y}Ga_y)_5O_{12}$ suggesting that Sc may have a similar structural role as Ga in the ceramics.

TABLE 2

| | | Cx | Cy | Ldom/nm | Lpeak/nm | Lcentroid/nm | FWHM/nm |
|---|---|---|---|---|---|---|---|
| Y7 | $(Y_{0.998}Ce_{0.002})_3(Al_{0.9}Sc_{0.1})_5O_{12}$ | 0.4168 | 0.5599 | 567.0 | 551 | 572.5 | 113.0 |
| Y1 | $(Y_{0.995}Ce_{0.005})_3(Al_{0.8}Sc_{0.2})_5O_{12}$ | 0.3983 | 0.5671 | 564.5 | 533 | 567.5 | 108.3 |
| Y8 | $(Y_{0.998}Ce_{0.002})_3(Al_{0.75}Sc_{0.25})_5O_{12}$ | 0.3792 | 0.5673 | 562.0 | 530 | 562.5 | 108.2 |
| Y6 | $(Y_{0.998}Ce_{0.002})_3(Al_{0.7}Sc_{0.3})_5O_{12}$ | 0.3762 | 0.5673 | 561.6 | 528 | 561.6 | 108.9 |
| Y9 | $(Y_{0.998}Ce_{0.002})_3(Al_{0.6}Sc_{0.4})_5O_{12}$ | 0.3755 | 0.5746 | 561.3 | 537 | 560.7 | 107.9 |
| Y3 | $(Y_{0.995}Ce_{0.005})_3(Al_{0.4}Sc_{0.6})_5O_{12}$ | 0.3579 | 0.5601 | 559.0 | 527 | 555.0 | 112.2 |
| | | Cx | Cy | Ldom | Lpeak | Lcentroid | FWHM |
| Y6 | $(Y_{0.998}Ce_{0.002})_3(Al_{0.7}Sc_{0.3})_5O_{12}$ | 0.3762 | 0.5673 | 561.6 | 528 | 561.6 | 108.9 |
| Y5 | $(Y_{0.995}Ce_{0.005})_3(Al_{0.7}Sc_{0.3})_5O_{12}$ | 0.383 | 0.567 | 562.6 | 535 | 563.7 | 112 |
| Y4 | $(Y_{0.98}Ce_{0.02})_3(Al_{0.7}Sc_{0.3})_5O_{12}$ | 0.4323 | 0.5504 | 569.0 | 556 | 580.9 | 107 |

Figure 4:
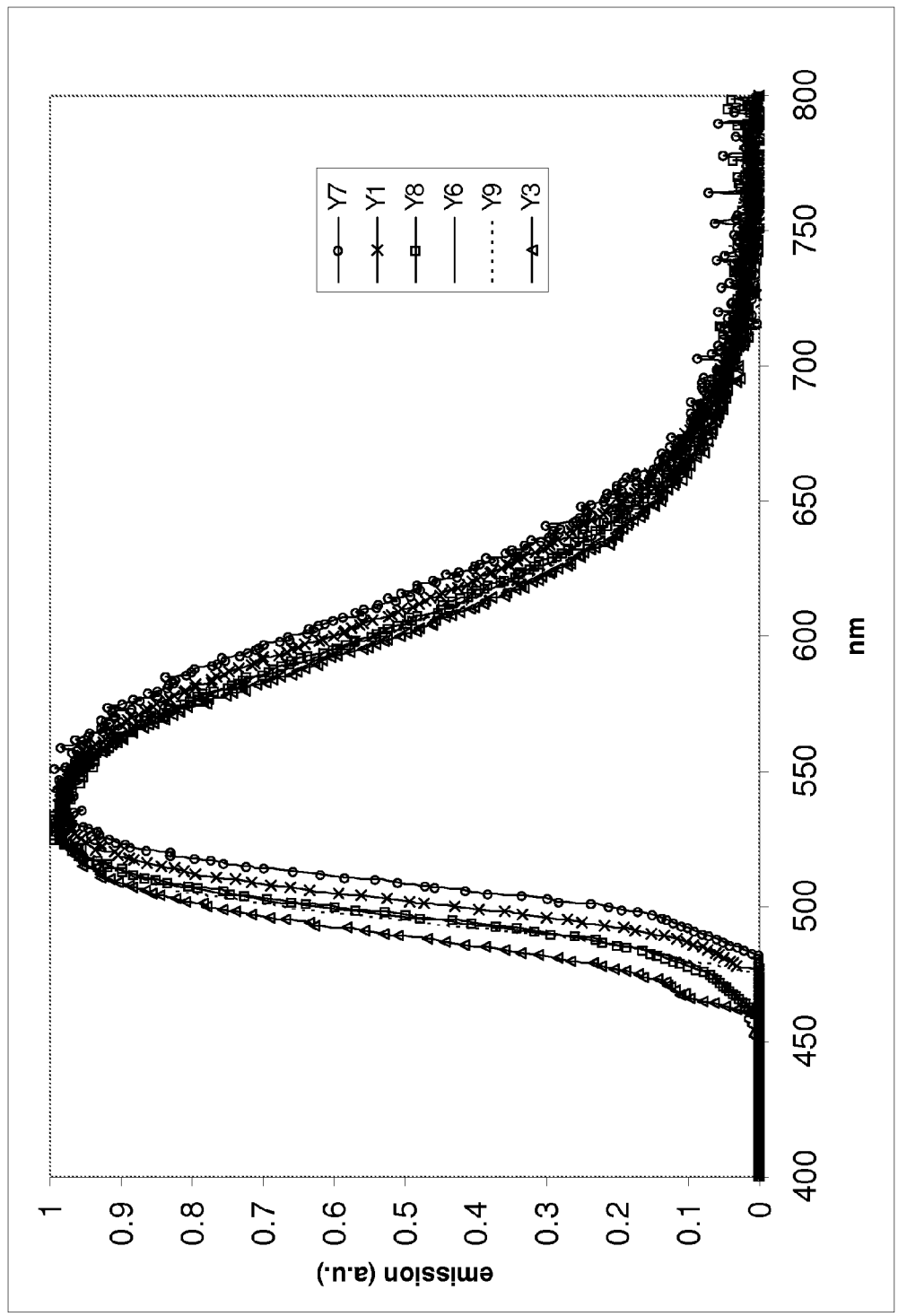
FIGS. 4 and 5 are emission spectra of the phosphors of Examples Y1, and Y3-Y9.
Figure 5:
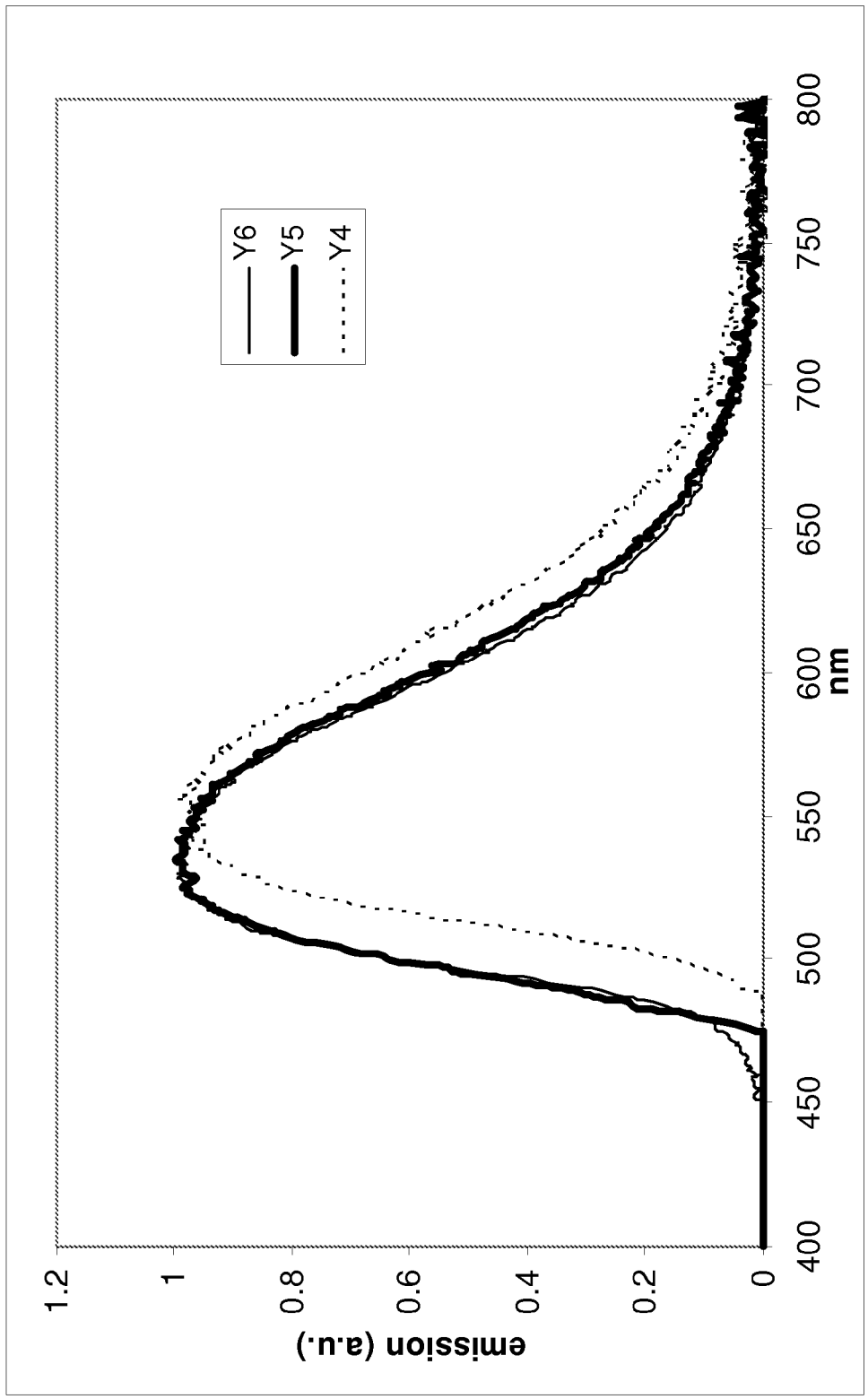

FIGS. 4 and 5 show emission spectra of examples Y1, and Y3-Y9. With regard to FIG. 5 (examples Y6, Y5 and Y4), it can be seen that as the Ce concentration increases (x=0.002, 0.005 and 0.02 for Y6, Y5 and Y4 respectively) the emission peak shifts towards the yellow region of the visible spectrum (longer wavelengths). This is also very similar to the YAG:Ce phosphor, in which the emission peak also shifts to yellow as Ce concentration increases.

Figure 6:
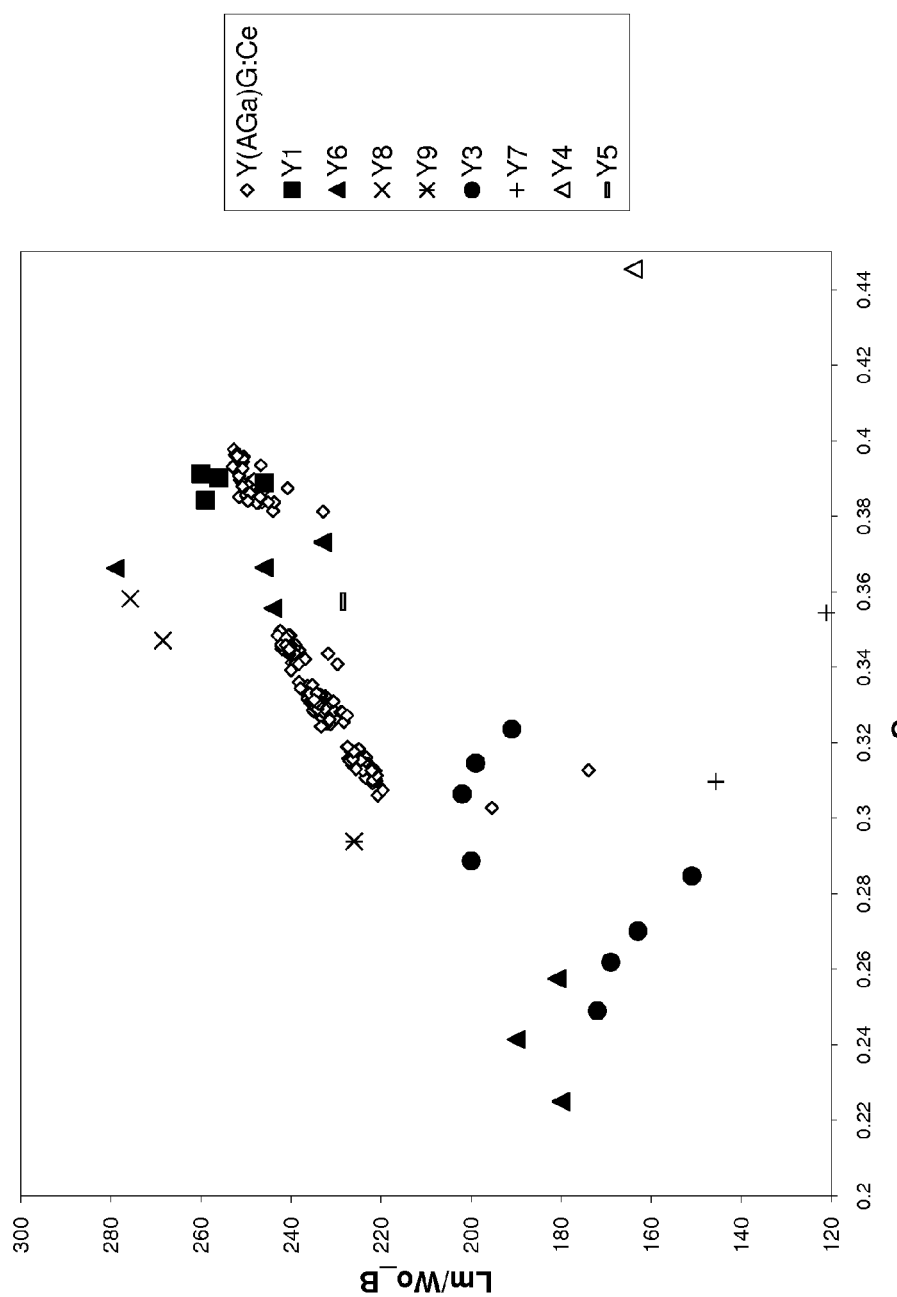
FIG. 6 is a graph of efficiency ($lm/W_{o-B}$) vs. the $C_x$ color coordinate for various phosphor compositions according to this invention compared with conventional $(Y_{1-x}Ce_x)_3(Al_{1-y}Ga_y)_5O_{12}$ phosphor.

FIG. 6 compares the efficiency ($Lm/W_{o-B}$) as a function of the $C_x$ color coordinate of the $(Y_{1-x}Ce_x)_3(Al_{1-y}Sc_y)_5O_{12}$ phosphors according to this invention with conventional $(Y_{1-x}Ce_x)_3(Al_{1-y}Ga_y)_5O_{12}$ phosphors. The efficiency measure, $Lm/W_{o-B}$, is the ratio of lumens from a white pc-LED (blue-emitting LED die plus yellow-emitting phosphor) to the optical power from the same blue-emitting LED die without the yellow phosphor. This normalizes the performance of blue-emitting LED die and takes into account the human eye's visual sensitivity for different wavelengths. Consequently this measure yields a better indication of the real performance of the phosphor. However, it should also be noted that the efficiency is also related to the scattering in the phosphor. Nonetheless it may still be used to show in general that the $(Y_{1-x}Ce_x)_3(Al_{1-y}Sc_y)_5O_{12}$ phosphor has a similar or better efficiency as compared to the Y(AGa)G:Ce. The measured quantum efficiencies for Y3, Y6, Y7 and Y9 were 90%, 98%, 92% and 97%, respectively.

A new phosphor has been demonstrated that can convert blue light emitted by an InGaN LED into to green or yellow light that can be used for white pc-LEDs or full-conversion green pc-LEDs. The phosphor of this invention can be used in a powder or bulk ceramic form. Preferably the phosphor has been sintered to form a translucent ceramic piece that is mounted to the blue-emitting LED die to generate a white light. For full-conversion, green pc-LEDs, the phosphor is preferably sintered to a near transparent ceramic. The phosphor may also be used in a converter element that is remote from the blue-emitting LED. For example, embedded in a polymer film which is placed at a distance from the LED or an array of LEDs or formed as a dome which is placed over individual or multiple LEDs.

While there have been shown and described what are at present considered to be the preferred embodiments of the invention, it will be apparent to those skilled in the art that various changes and modifications can be made herein without departing from the scope of the invention as defined by the appended claims.

I claim:

1. A phosphor having a composition represented by $(Y_{1-x}Ce_x)_3(Al_{1-y}Sc_y)_5O_{12}$ wherein $0<x\leq0.002$ and $0.2<y\leq0.6$.

2. The phosphor of claim 1 wherein the phosphor when excited emits light having color coordinates Cx and Cy wherein $C_x$ is in a range from about 0.35 to about 0.44 and $C_y$ is in a range from about 0.55 to about 0.58.

3. A phosphor-conversion LED comprising: an LED that emits a blue light and a phosphor for converting at least a portion of the blue light into light of a different wavelength, the phosphor having a composition represented by $(Y_{1-x}Ce_x)_3(Al_{1-y}Sc_y)_5O_{12}$ wherein $0<x\leq0.002$ and $0.2\leq y\leq0.6$.

4. The phosphor-conversion LED of claim 3 wherein the blue light has a wavelength from about 420 nm to about 490 nm.

5. The phosphor-conversion LED of claim 3 wherein the phosphor when excited by the blue light by emitted by the LED emits light having color coordinates Cx and Cy wherein $C_x$ is in a range from about 0.35 to about 0.44 and $C_y$ is in a range from about 0.55 to about 0.58.

6. The phosphor-conversion LED of claim 5 wherein the blue light has a wavelength from about 420 nm to about 490 nm.

* * * * *